United States Patent
Ryan et al.

[19]

[11] Patent Number: 6,072,814
[45] Date of Patent: *Jun. 6, 2000

[54] LASER DIODE MODULE WITH INTEGRAL COOLING

[75] Inventors: Daniel J. Ryan, Sycamore; Brian L. Peterson, Woodstock; John E. Jackson, Carol Stream; Carl J. Sarro, Hampshire, all of Ill.

[73] Assignee: Videojet Systems International, Inc, Wood Dale, Ill.

[*] Notice: This patent issued on a continued prosecution application filed under 37 CFR 1.53(d), and is subject to the twenty year patent term provisions of 35 U.S.C. 154(a)(2).

[21] Appl. No.: 08/866,472

[22] Filed: May 30, 1997

[51] Int. Cl.$^7$ ........................................... H01S 3/04
[52] U.S. Cl. ................................ 372/35; 372/43; 385/93
[58] Field of Search ........................ 372/34–36, 43, 372/70, 75, 92, 98, 101, 109; 385/31, 33, 88, 92, 93

[56] References Cited

U.S. PATENT DOCUMENTS

| | | | |
|---|---|---|---|
| 3,835,414 | 9/1974 | Ahearn | 372/101 X |
| 4,306,278 | 12/1981 | Fulton et al. | 372/75 X |
| 4,860,298 | 8/1989 | Botez et al. | 372/45 |
| 4,979,180 | 12/1990 | Muncheryan | 372/92 |
| 4,985,897 | 1/1991 | Botez et al. | 372/50 |
| 5,105,429 | 4/1992 | Mundinger et al. | 372/34 |
| 5,105,430 | 4/1992 | Mundinger et al. | 372/35 |
| 5,107,091 | 4/1992 | Wagner et al. | 372/36 X |
| 5,212,707 | 5/1993 | Heidel et al. | 372/36 X |
| 5,263,536 | 11/1993 | Hulburd et al. | 165/80.4 |
| 5,495,490 | 2/1996 | Rice et al. | 372/34 |
| 5,617,492 | 4/1997 | Beach et al. | 385/33 |
| 5,663,980 | 9/1997 | Adachi | 372/34 X |
| 5,666,450 | 9/1997 | Fujimura et al. | 385/93 |
| 5,689,522 | 11/1997 | Beach | 372/75 |
| 5,745,514 | 4/1998 | Patel et al. | 372/43 |

FOREIGN PATENT DOCUMENTS

| | | | |
|---|---|---|---|
| 0 631 164 | 12/1994 | European Pat. Off. | G02B 6/42 |
| 58187961 | 11/1983 | Japan | G03G 15/04 |
| 60015987 | 1/1985 | Japan | H01S 3/18 |
| 61067807 | 4/1986 | Japan | G02B 6/42 |
| 07287130 | 10/1995 | Japan | G02B 6/00 |

OTHER PUBLICATIONS

"Laser Focus World" periodical, Aug. 1992, pp. 79–89, "Long–wavelength diode lasers are tailored for fiberoptics", J. Hecht.
Spectra Diode Labs Laser Diode Specifications, 1992 SDL™–3450–P5, SDL™–3490–P5, 2 pages.
Laser Diode Operator's Manual & Technical notes, Chapter 9 (pp 69–78), 1994, SDL (San Jose, CA).
Laser Diode, Inc. Short Form Catalog, (High Power Components Catalog—2 pages), Acquired Sep. 21, 1993.
Laser Diode Products, Inc. Short Form Catalog (C W Laser Diodes—2 pages), Acquired Sep. 21, 1993.
Applied Optronics Corp. Laser Diode Specifications (4 pages), Jan. 1994.

(List continued on next page.)

*Primary Examiner*—John D. Lee
*Attorney, Agent, or Firm*—Piper Marbury Rudnick & Wolfe

[57] ABSTRACT

A laser module with integral cooling is disclosed. The module is intended for coupling to a fiber optic cable for various applications. The module is generally cylindrical and has a laser diode array mounted centrally therein. A cooling channel is in thermal relation with the array either directly or via a diamond substrate. A fiber optic coupler mates with the portion of the housing carrying the array and carries a lens subassembly. During assembly, the coupler is positioned to accurately focus the output of the array into a beam suitable for transmission to the fiber optic cable. Coolant is coupled to the channel with a removable coupling manifold or similar arrangement which may also carry electrical contacts for energizing the array.

17 Claims, 6 Drawing Sheets

OTHER PUBLICATIONS

"Forced–Convection . . . Heat Sinks for High Power–Density Microelectronics", Phillip et al., Mar. 1987, 31 pages, No Journal Name.

Laser Tech Briefs, Winter 1994, pp. 32, 34, 36, "Scalable Diode Pumping for End–Pumped Laser Systems".

Spire Corporation, Diode Laser Array Specifications (3 pages), Jul. 21, 1993.

John G. Endriz et al:"High Power Diode Laser Arrays", IEEE Journal of Quantum Electronics, vol. 28, No. 4, Apr. 1992, pp. 952–965.

J. A. Skidmore et al:"High–Power Continuous Wave 690nm AlGaInP Laser–Diode Arrays" Applied Physics Letters, vol. 66, No. 10, Mar. 6, 1995, pp. 1163–1165.

LASER DIODE MODULE WITH INTEGRAL COOLING

BACKGROUND OF THE INVENTION

This invention relates to semiconductor laser diodes. More specifically, it relates to laser diode modules which may include a plurality of semiconductor laser diodes. Such laser diodes are capable of generating a relatively high beam output for their size and are used in such applications as fiber optic communications and laser surgery. Typically, such semiconductor diode lasers emit energy in the wavelength range of 0.805 to 1.55 micrometers for efficient coupling to fiber optics. For a background discussion of such semiconductor diode lasers see Laser Focus World, August, 1992, pgs. 79 et seq. One type of a laser diode suitable for use with the present invention is disclosed in U.S. Pat. Nos. 4,860,298 and 4,985,897 both to Dan Botez et al. hereby incorporated by reference. The laser diode there disclosed typically comprise between twenty to forty laser elements and having a size of 100 microns thick by 0.5 millimeters wide by 1.0 millimeters long. Such modules are capable of generating in excess of 15 watts. These devices are capable of many applications, but a principal problem with their use is the dissipation of heat, which is considerable at this relatively high output to size ratio.

Typically, the laser outputs are concentrated into a beam focused by a lens system into a single beam which may, if desired, thereafter be coupled to a fiber optic cable or similar device. Details of the lasers and the means for optically focusing the beams are disclosed in the aforementioned Botez et al. patents, although they are discussed herein as necessary to an understanding of the invention. Such devices typically have a current input of between 0.5 and ten amps or higher and can create an output of between 0.2 and ten watts or more of optical power. One limiting parameter on light output is heat build-up. Without efficient cooling, the optical power output decreases rather dramatically as temperature increases. As a rule of thumb, if ten watts of optical power are created, there are approximately ten watts of heat which must be dissipated.

Previous designs have been able to obtain only approximately 200 milliwatts of optical power without some form of cooling. Thus, the laser module according to the present invention is capable of optical power orders of magnitude greater than the prior art. Such a high optical output device has many applications if it can be appropriately packaged, focused and cooled at a reasonable cost. Some of these applications include marking substrates with alpha-numeric information, medical applications, laser type-setting, desk-top manufacturing, manufacture of semi-conductor devices and many others. In short, a high output, low-cost laser module is desirable and would be well received in the marketplace.

As indicated, the prior art has not heretofore been capable of such high output without significant additional expense to add on cooling and lens systems external to the module. It is an object of the present invention to overcome these disadvantages by incorporating both into the module in a simple and inexpensive manner.

Existing lower power (less than 1 watt) laser diodes are currently available in three general packaging formats. The most basic is an open heat sink package, usually in the form of a C-mount. This format is intended for custom integration with optical lens coupling and cooling systems which must be added on to the laser module. A second form of packaging, cylindrical packaging such as the TO series, is also a common format used where coupling to fiber optics is required but cooling is not required or can be satisfactorily accomplished by mounting the device to a cold (usually metallic) surface.

Where higher power output is required a high heat load (HHL) package is commonly used. The HHL is a rectangular package often provided with fiber coupling. The package may incorporate thermoelectric cooling, but usually requires mounting to an external cooling device or providing a submount that provides for micro-channel cooling, impingement cooling or back cooling. All of these high efficiency cooling and mounting techniques require further integration into a package that does not by itself provide for fiber coupling. In short, the lack of a unified design results in excessive cost, undue size and thereby limits the usefulness of the device.

In order to provide for practical application of high powered laser diodes, it is necessary to provide efficient cooling and fiber optic coupling in a low-cost integrated package. It is necessary to overcome the inherent difficulties of the HHL rectangular package which does not allow for low-cost fiber optic coupling and which often requires electrical connections to be made by soldering to a glass insulated feedthrough. Furthermore, such packaging is inherently expensive and difficult to interface. The present invention overcomes these problems by packaging the laser in a cylindrical form that incorporates direct water cooling of the laser chip, integrated fiber optic coupling and easy to connect and disconnect electrical leads.

It is accordingly an object of the present invention to provide a high-powered laser diode module in a cylindrical, but modular building block form. It is a further object to provide such a module with a quick connect/disconnect mounting feature and with integrated fiber optic coupling. A further object of the invention is to provide such a module with integrated liquid cooling and simple alignment features whereby the module can be designed and implemented with inexpensive materials and low-production costs to facilitate widespread application of this technology.

These and other objects of the invention will be apparent from the remaining portion of this specification.

BRIEF DESCRIPTION OF THE DRAWINGS

FIG. 4a illustrates a third embodiment of the invention utilizing a tubular passage for the liquid coolant and in which the laser module is directly mounted to the tubing.

FIG. 4b illustrates the electrical connections for the embodiment of FIG. 4a.

FIG. 4c is an enlarged perspective view of the FIG. 4a embodiment.

DETAILED DESCRIPTION

Figure 1:
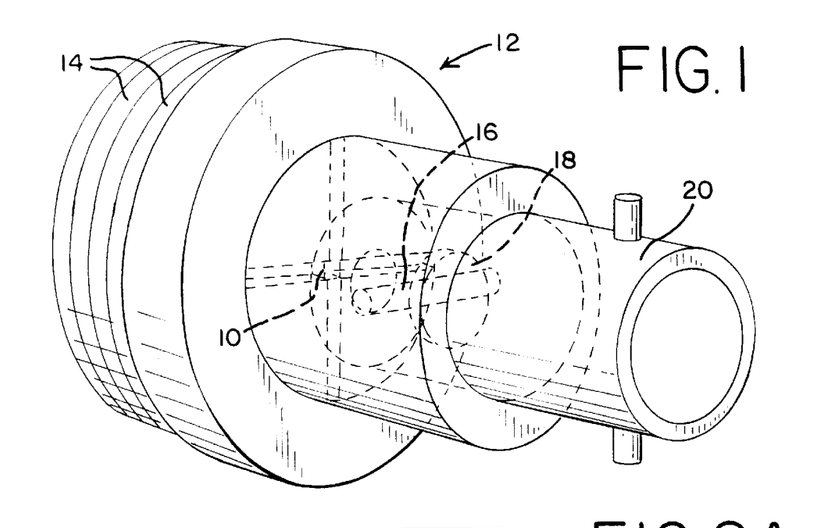
FIG. 1 is a perspective view of the concept of the invention employing a cylindrical laser module which is suitable for connection to a fiber optic cable.

Referring to FIG. 1, a cylindrical laser module is conceptually illustrated. The laser diodes are mounted on a substrate positioned at 10 within a cylindrical body 12. Electrical contacts to the lasers are provided on the cylindrical body as at 14. Collimating lens 16 and objective lens 18 serve to collimate and focus the beams from the lasers into a single beam suitable for coupling to fiber optics. A modified ST-coupler 20 is integrally provided as part of the laser module. Thus, a fiber optic cable or the like is simply connected to the ST-coupler and automatically couples the fiber optics to the laser output as it passes through the objective lens 18. Not shown in FIG. 1 is the manner in which this module is intended to be mounted and cooled.

Figure 2A:
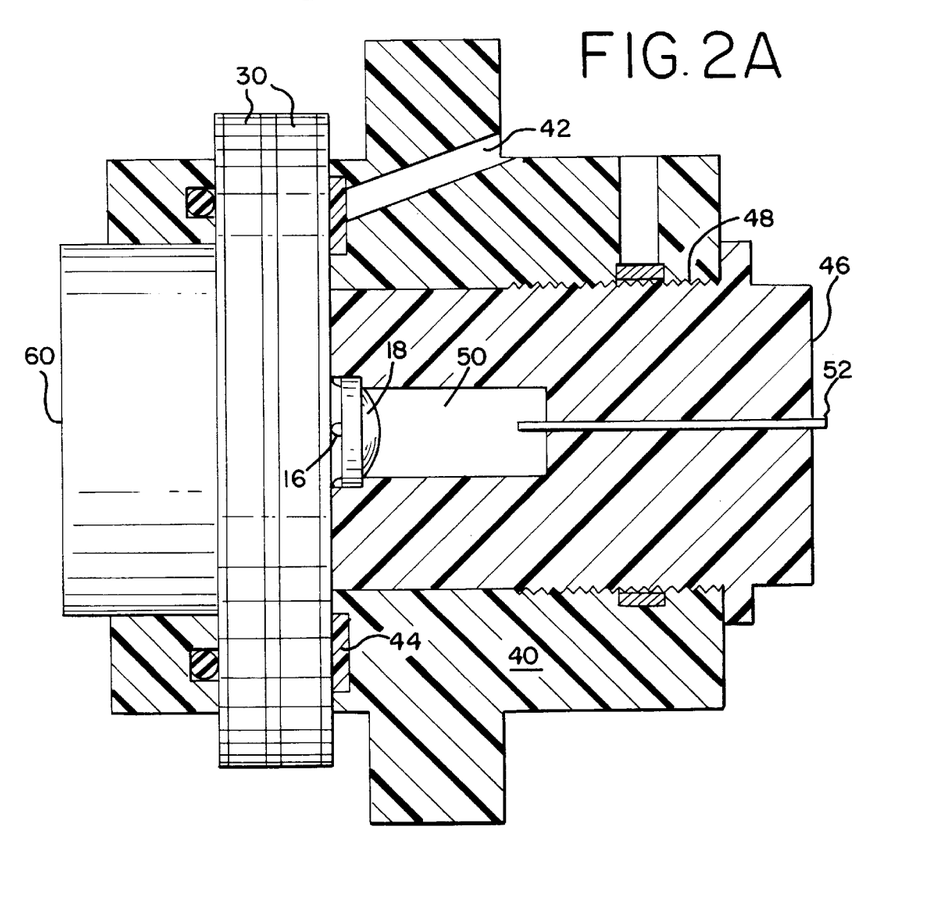
FIG. 2a is a sectional view of a first embodiment of the invention.
Figures 2B, 2C:
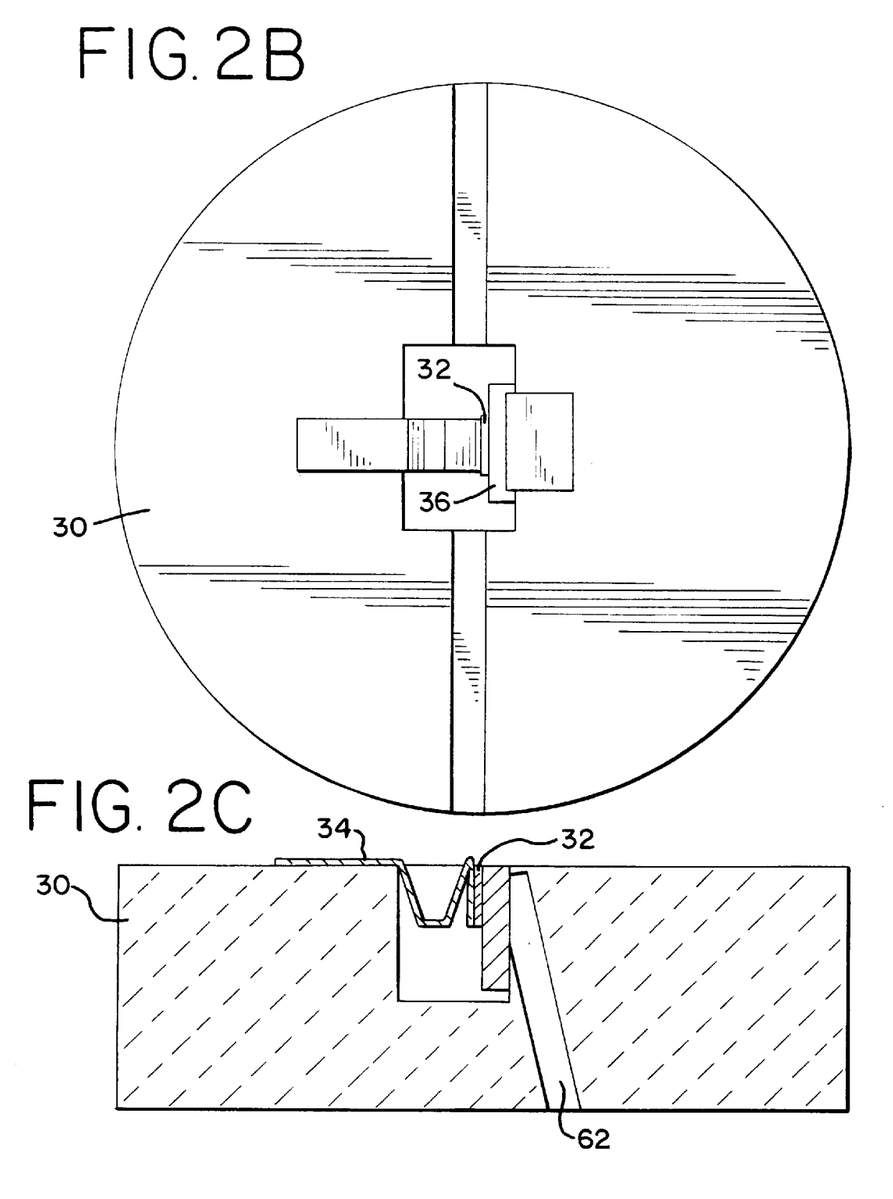
FIG. 2b is a top view of the disk on which the diode module is mounted.
FIG. 2c is a side sectional view of the disk of FIG. 2b showing the coolant and mounting details.

Referring to FIGS. 2a–c, a first embodiment of the invention is illustrated. A ceramic disk 30 has mounted thereon at the central portion thereof, a laser module chip 32 (FIGS. 2b and 2c). Electrical connections to the module are plated on the outer periphery of the cylindrical mounting for eventual connection to the laser chip 32. Thus, as shown in FIG. 2c electrode 34 is connected to the chip. The chip itself is preferably not mounted directly to the ceramic but to an industrial diamond submount 36.

The output from the laser module is coupled through a lens system to a fiber optic output. For that purpose, ceramic disk 30 is secured to a plastic body 40. This is accomplished, as shown in FIG. 2a, by inserting epoxy into openings 42 so as to create epoxy bonds 44 around the circumference of the disk 30 joining the plastic body 40 thereto. Thus, the plastic body 40 has ceramic disk 30 bonded thereto with epoxy. The ceramic disk incorporates two electrical contact bands deposited around its circumference providing the electrical interface to a laser power supply (not shown). The laser and diamond are inserted into the ceramic substrate secured thereto and electrical contact made using a standard ball bond or ribbon connections as shown in FIG. 2c at 34. A structural adhesive may be provided around the perimeter of the interface to ensure a hermetic seal against the entry of moisture.

The ST-type coupler is shown in FIG. 2a at 46. The coupler is joined to the plastic body 40 by screw threads as at 48. Mounted within the coupler, in a recess 50, is a spherical objective lens 18.

The collimating lens 16 is mounted therebehind. As the coupler 46 is threadably inserted into the plastic body 40, alignment is achieved ensuring that the lens accurately focuses the output of the laser device. When the coupler is correctly positioned, epoxy can be placed in the screw threads permanently to secure the coupler in relation to the plastic body 40 which in turn is bonded to the ceramic disk 30. This eliminates the need for a fiber optic pigtail.

Thus, the collimating lens and focusing optics are mounted inside the ST-coupler 46 that is threaded into the plastic housing. The pitch of the threads incorporated into the coupler and the plastic body allow accurate focusing of the laser beam into a fiber 52. Lateral positioning adjustments are performed by moving the plastic body over the surface of the ceramic to obtain maximum light coupling into the fiber. Angular adjustment is performed by the rotation of the plastic housing with respect to the ceramic base. Optical alignment is fixed by injecting adhesive between the plastic body 40 and the ceramic base 30 to form a sheer bond. Preferably a metal or plastic retaining ring is then installed to improve the structural integrity of the outer body.

The module as thus far described interfaces with a cooling fixture. The position of the cooling fixture is indicated generally at 60 in FIG. 2a. As illustrated in FIG. 2c, the cooling fixture permits a liquid coolant to circulate in a channel 62 in the ceramic disk 30. Channel 62 is in contact with the diamond 36 on which the laser module 32 is mounted for heat dissipation purposes. Preferably the cooling fixture mates with a coolant manifold having a check valve to prevent coolant from reaching the ceramic until the manifold has been secured thereto. Another valve may be provided to prevent leakage when the coolant manifold is disconnected from the module. Thus, cooling for the laser diode is provided along with a mechanism for quickly disconnecting the laser module from the coolant source. Suitable disconnect features and manifolds are detailed in the remaining embodiments described hereafter.

Figure 3A:
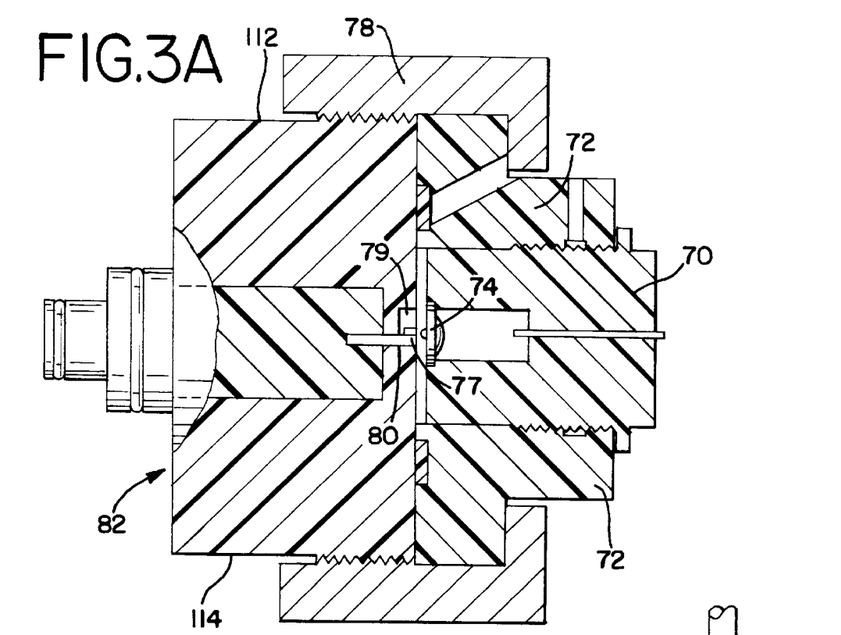
FIG. 3a is a side sectional view of a second embodiment of the invention.
Figure 3B:
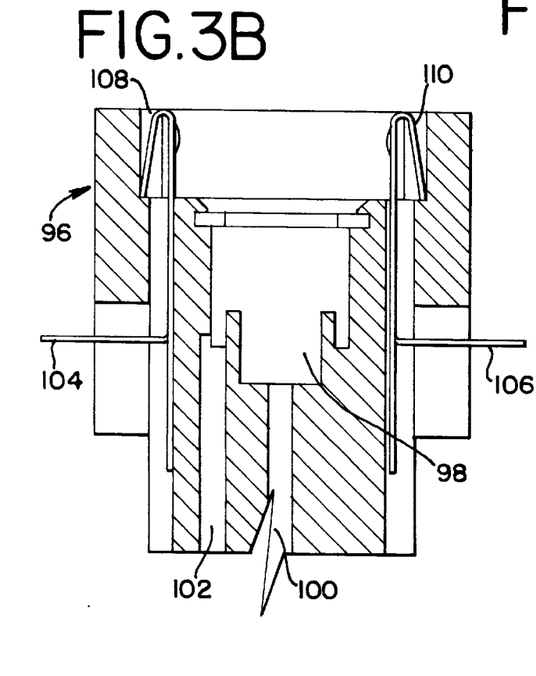
FIGS. 3b and 3c are sectional schematics illustrating the manner in which the module of FIG. 3a is coupled to a cooling manifold.
Figure 3C:
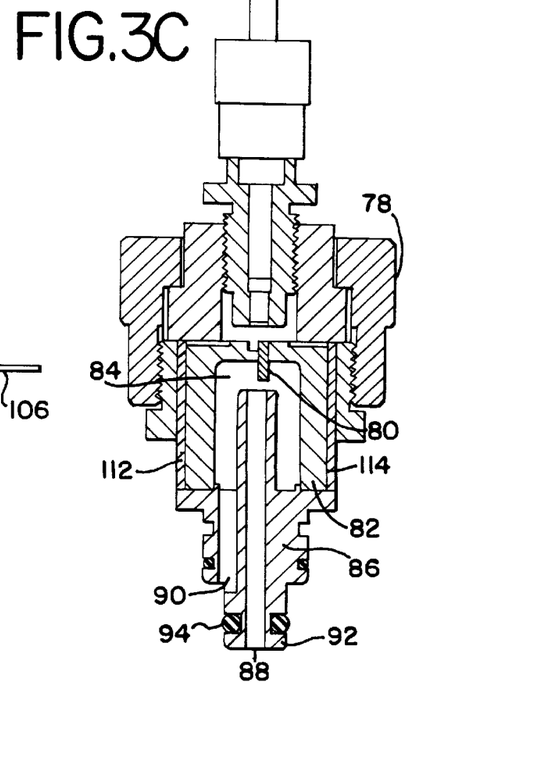

Referring to FIGS. 3a–c, a second embodiment of the invention is illustrated. In this embodiment, the ST-coupler 70 and plastic body 72 are the same as in the first embodiment and the focusing and collimating lens are similarly mounted. Thus, an ST-coupler 70 is secured to a plastic body 72. The lenses 74 are secured to the coupler and move relative to the plastic body until proper focus and alignment are achieved. Thereafter epoxy is employed to permanently secure the assembly together. A structural support ring 78 is deployed around the assembly. In this embodiment, the laser diode 77 is secured in a cavity 79 to a diamond substrate 80 mounted to a plastic block 82. Note the absence of the ceramic disk utilized in the first embodiment. Incorporated into the block 82 is a cooling fixture which contacts the substrate 80 and is adapted to engage a cooling manifold as shown in FIGS. 3b and 3c.

The alignment procedure is relatively straightforward. The coupler 70, containing the lenses 74, are held stationary while the plastic block or base 82 containing the diamond substrate 80 on which the laser diode 77 is mounted, is manipulated while the diode generates a laser beam. The beam is aligned with the center line of the lenses 74. When that occurs, the epoxy is injected as previously described to lock the base and coupler together. The alignment process may be accomplished in an alignment fixture typically consisting of an alignment base and an observation stand. The base permits 360° rotation as well as XY translational movement. A fiber optic sleeve coupled, for example, to a CCD Camera is connected to a monitor. Once the laser beam is observed to be in its optimized position, the epoxy is injected. Thereafter the structural support ring 78 is tightened to provide additional mechanical holding force.

Referring to FIGS. 3b and 3c, the details of the cooling fixture and its interconnection to a manifold coupler 96 are illustrated. Referring to FIG. 3c, it will be seen that the block 82 includes a horseshoe shaped cavity 84 through which a liquid coolant can flow and contact the diamond 80 on which the laser diode is disposed. A water coupler 86 is secured to the back block 82, as by epoxy or other means. The water coupler 86 includes a central bore 88 communicating with the horseshoe shaped channel 84 and an exit port 90. As indicated by the arrows in FIG. 3c, the channel communication is intended to permit liquid coolant to enter through the central bore 88, circulate through the horseshoe shaped channel 84 thereby to contact the diamond 80 and carry heat therefrom and finally exit through port 90. The water coupling 86 terminates in a nipple fitting 92 having an O-ring 94 to prevent leakage. Fitting 92 is adapted to be received in a manifold coupler 96 (FIG. 3b) which in turn is secured to a source of liquid coolant.

Referring to FIG. 3b the details of the manifold coupler 96 are illustrated. The nipple fitting 92 is received in the receptacle 98 where the O-ring 94 prevents leakage. Liquid flows from a supply conduit 100 into the central bore 88 when the two units are secured together. Coolant which has been circulated is returned from the module through the outlet port 90 into conduit 102 in the coupler 96 to a heat exchange device which removes the heat from the coolant so that it may be recirculated for further use.

Preferably, the manifold coupler 96 not only couples the liquid coolant to the laser module but also carries the electrical contacts which power the laser module. As illustrated in FIG. 3b, spring contacts 104 and 106 are provided on the outer circumference of the coupler. Note that the contacts terminate in spring arms 108 and 110 which are intended to engage electrical contact surfaces 112 and 114 on the outer circumference of the block 82 in FIG. 3c.

In summary, the second embodiment includes a pre-molded plastic block 82 including a fluid coupler that also serves as the mounting base for the cylindrical laser module. This reduces the size of the laser submount, principally by eliminating the ceramic structure of the first embodiment. In this embodiment, the laser submount is partially submersed in the cooling fluid. That is, a portion of the diamond on which the laser module is mounted is disposed in the horseshoe shaped channel 84 (see FIG. 3c). Finally, in this embodiment the electrical contacts are placed on the manifold coupler to provide a quick disconnect feature for both the electrical and the cooling required by the module.

Figures 4A, 4B, 4C:
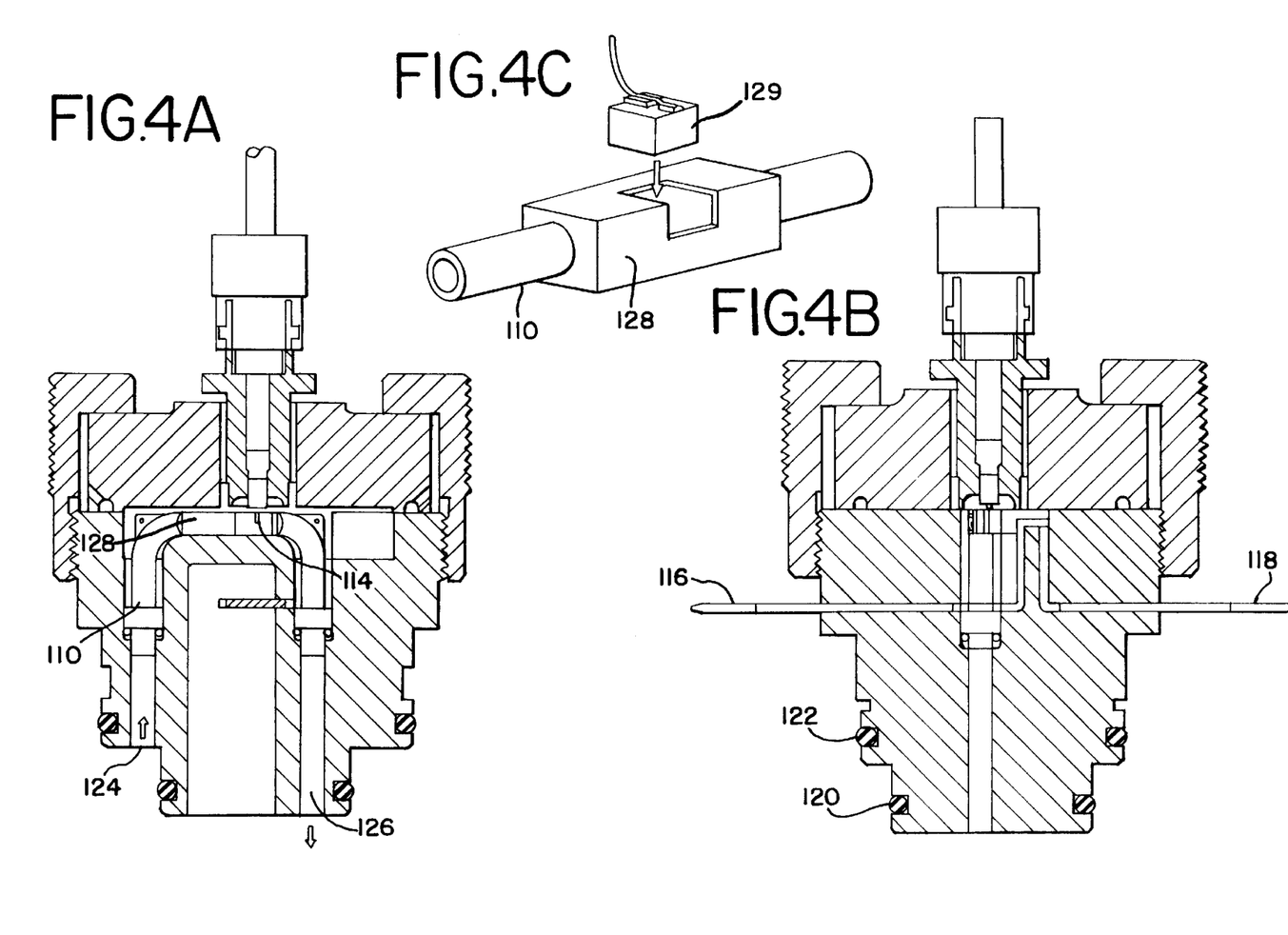

Referring to FIGS. 4a and b, a third embodiment of the invention is illustrated. This embodiment is suited for applications requiring higher coolant flow to dissipate increased heat load. Such an application would occur, for example, during quasi-continuous wave (CW) operation. In the embodiment of FIGS. 4a and b, the horseshoe shaped conduit 84 of FIG. 3 and the channel 88 are replaced with a copper tube 110 formed in the shape of the letter C. A diamond submount 114, to which the laser diode module is secured, is inserted through an opening in the tube 110 for direct cooling by the liquid. It is secured in place using solder or structural adhesive.

As shown in FIG. 4b, the electrical contacts 116 and 118 may be terminal lugs molded into the plastic housing representing the positive and negative terminals. Contacts attached to the laser diode and laser submount are soldered to the terminal lugs. This design is preferable to the other designs for high heat dissipation because the copper tube 110 has a relatively simple straight in and out path which is more efficient in conducting heat away. In addition, the tube can be leakproof tested and checked prior to installation into the housing assembly. Also, alignment is easier due to the relaxed tolerances of the tube design versus the fixed tolerances in the molded embodiment of FIGS. 3b and 3c.

The design illustrated in FIG. 4a is adapted to be secured to a source of liquid coolant by means of an appropriate manifold coupler of the type generally illustrated in FIG. 3b. The O-rings 120 and 122 illustrated in FIGS. 4a and b, are provided for sealing the unit to such a manifold coupler. As illustrated in the drawings, the copper tube 110 is round at the input and output points 124 and 126. Its cross-section, however, is preferably rectangular at its center section as illustrated in the perspective view in FIG. 4c. This section of the copper tube 128 is notched out to receive the laser submount 129 which is then epoxy bonded or soldered into place. The laser diode is disposed on the upper surface of the submount. An alternative, which is possible with this design, is the complete elimination of the diamond submount. The laser diode can be mounted directly to the tubing 110, on the outside thereof, thereby further simplifying the design and fabrication process.

Figure 5:
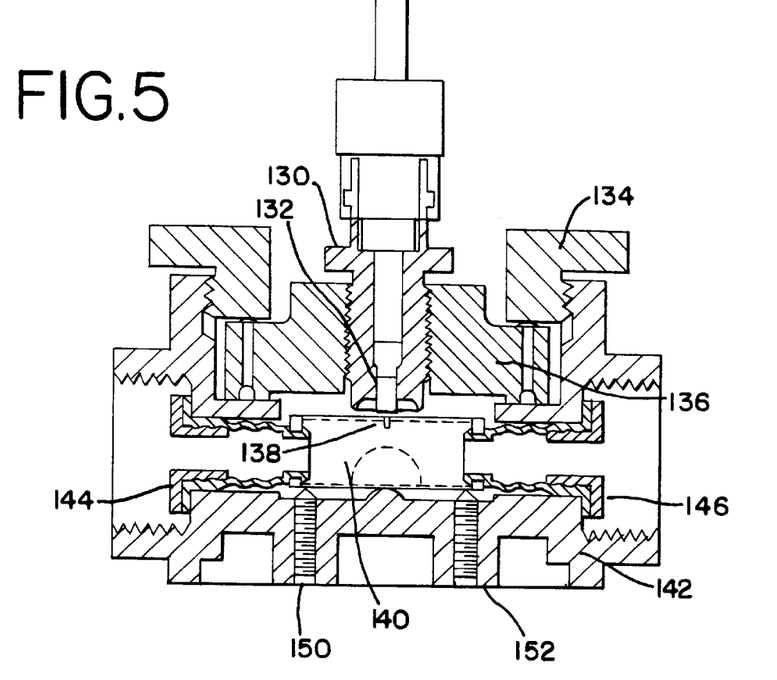
FIG. 5 is a fourth embodiment of the invention illustrating a simplified and, in some applications, preferred embodiment in which the liquid coolant is introduced radially into the cylindrical module.

Referring to FIG. 5, a fourth embodiment of the laser module according to the invention is illustrated. In this embodiment, the ST-coupler again serves as the lens mount. The coupler 130 has the lens assembly 132 mounted therein. A retaining ring 134 secures the ST-coupling and housing 136 securely after the alignment and assembly procedure. The laser diode submount 138 is soldered directly to a copper tube 140 which extends radially through the cylindrical package. The rear portion of the laser submount is exposed directly to the fluid coolant through an opening in the tube 140. The tube 140 is disposed between a base 142 which is mated to the ST-coupling block 130 and the forward section of the housing 136. Liquid coolant is supplied to the tube 140 by means of insertable plugs 144 and 146 and elastomer tube 154 and 156. These tubes are adapted to engage the tube 140 at either end thereof thereby to form a conduit through which liquid can be transported into and out of the module in a straight path thereby reducing the fluid pressure drop.

Disposed in the base 142 are threaded bores 150 and 152. Screws are disposed in the bores for purposes of permitting alignment of the laser module during assembly. As illustrated, the screws bear against the tube 140 which in turn carries the laser diode 138. By adjusting the angular position of the copper tubing using these screws it is possible to precisely align the laser module output with the lens 132 after the housing and ST-coupler block have been securely bonded. Thereafter the screws may be permanently fixed in the bores 150 and 152 to prevent any change in alignment. Because of its simple and straight through design, the embodiment of FIG. 5 is highly efficient, simple to manufacture and operate and relatively low in cost as compared with the prior art. The electrical connections to the laser module can be made in any of the various ways described in connection with the previous embodiments or in other ways known to those skilled in this art. For many applications this design is preferred.

The alignment process is performed in four steps. First, the device is mounted into an alignment fixture that interfaces to water and the drive electronics. While operating at a low duty cycle an imaging fiber optic camera system is attached to the ST-coupler. The plastic body is then rotated to set the focus adjustment for minimum spot size (best focus) while the coupler is held fixed. In the second step, lateral angular adjustment is performed until the laser diode output is normal with respect to the plane defined by the interface of the body and optics housing. In the next step, the angular position of the collimating lens is aligned with the laser diode output. For this purpose, the optics housing is rotated until a symmetrical collimated beam profile is obtained. Finally, lateral adjustment of the optics housing is accomplished to maximize power output. It is at this point, that the entire assembly may be epoxy injected as previously described to permanently secure the device in optical alignment and to hermetically seal it against unwanted intrusion of moisture.

Figure 6:
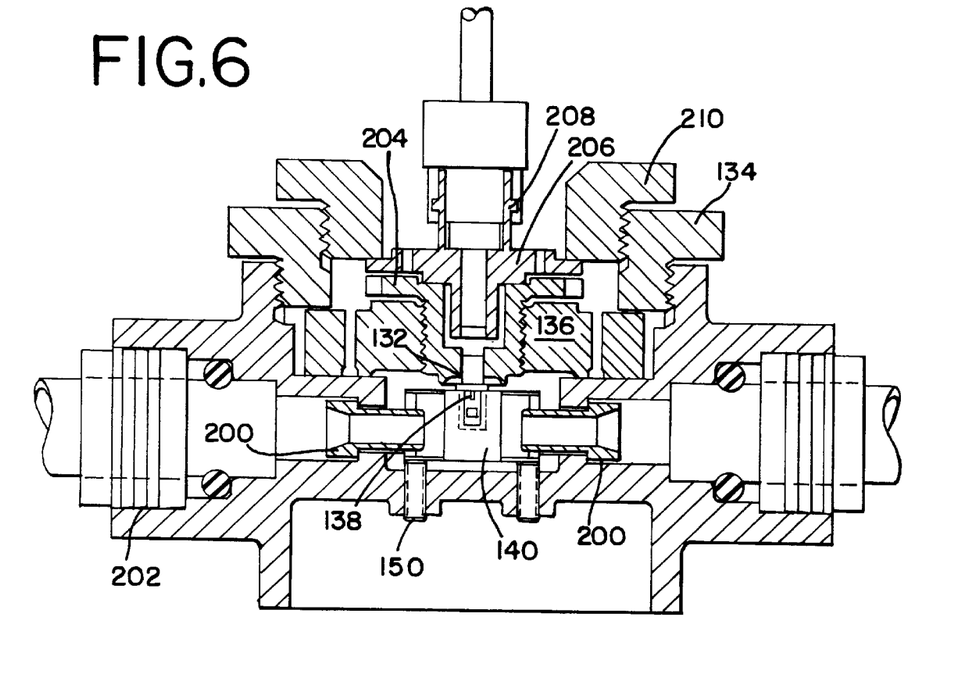
FIG. 6 is a fifth and presently preferred embodiment of the invention.

The embodiment of FIG. 6 is similar to the FIG. 5 embodiment with a few exceptions. In the FIG. 6 embodiment, the length of the coolant tube is shorter than in the FIG. 5 embodiment. Also, the coolant channel is provided with a tubular fitting adapted to engage a quick disconnect coupler 202. More significantly, the FIG. 6 embodiment differs from the embodiment of FIG. 5 by utilizing a two-part fitting to permit better alignment of the lens assembly. The optical housing 136 screw-threadably receives a lens fitting 204 which contains the lens assembly 132. This permits precise focusing of the output from the laser 138 after which the fitting 204 is secured in place with epoxy as previously described.

A separate fiber optic fitting 206 is provided which carries the ST-coupler assembly 208 intended to engage a fiber optic cable element. The fitting 206 slidably bears against the lens fitting 204 to permit alignment of the fiber optic element with the output of the lens assembly 132. When properly aligned, it is bonded in place and secured by a separate retaining ring element 210, similar to retaining ring 134 which now secures only the lens fitting 204.

In summary, the FIG. 6 embodiment is a slight improvement upon the FIG. 5 embodiment in that it permits more precise and easier alignment of the lens system with the laser and the fiber optic with the lens system. The alignment process is similar to that described for the FIG. 5 embodiment modified to account for the separate fittings 204 and 206.

Figures 6A, 6B:
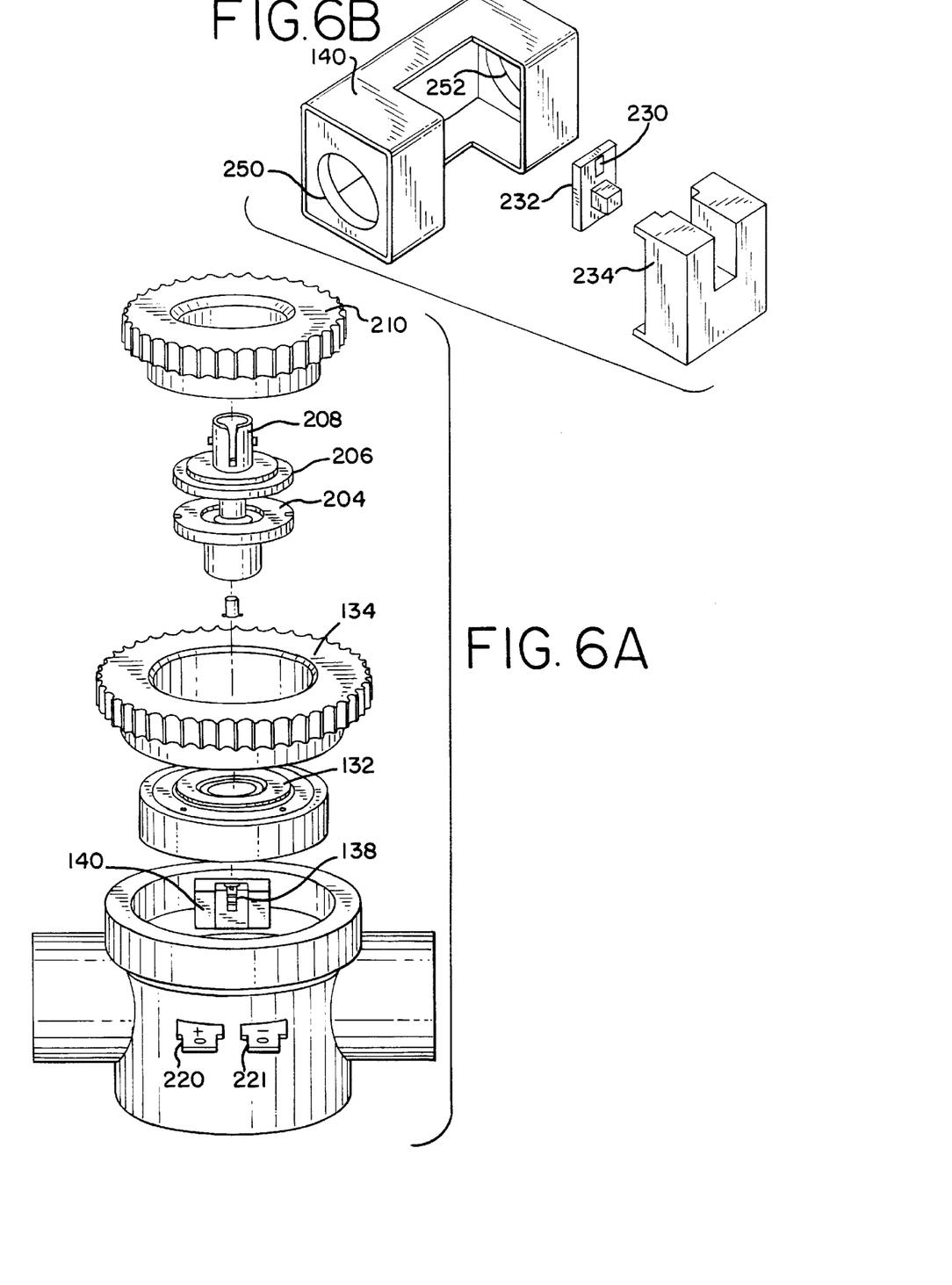
FIG. 6a is an exploded perspective view of the FIG. 6 embodiment.
FIG. 6b is an exploded perspective view on an enlarged scale of the laser mounting and coolant tube.

FIG. 6a is an exploded perspective view of the FIG. 6 embodiment. Note in particular, the laser element 138 disposed inside the coolant tube 140 and the electrical contacts 220 and 221 which provide electrical power to the diode. FIG. 6b is an exploded perspective view of a portion of the FIG. 6 embodiment illustrating the manner in which the mounting block and laser diode are received in rectangular portion of the coolant tube 140. The laser diode 230 is mounted on the diamond substrate 232 which, in turn, is secured to the mounting block 234. The mounting block is then received as an integral part of the coolant tube 140. Coolant passing through circular openings 250 and 252 removes the heat generated during laser operation.

As each of the foregoing embodiments has particular advantages and disadvantages, the selection of which module is preferred will depend upon the application including the output required, cost considerations and other factors. Nevertheless, the present invention, in its different embodiments, discloses a cylindrical laser module which is low in cost, can be easily assembled and aligned, permanently secured in the aligned condition and quickly connected and disconnected to a liquid coolant and a laser power supply. This capability and the features of the device have not heretofore been available.

While preferred embodiments of the present invention have been illustrated and described, it will be understood by those of ordinary skill in the art that changes and modifications can be made without departing from the invention in its broader aspects. Various features of the present invention are set forth in the following claims.

What is claimed is:

1. A laser module with integral cooling comprising:

a) a first body section carrying a laser diode array and including means for circulating a liquid coolant in thermal relation with said diode array, said means for circulating includes a channel through which said coolant is circulated and means for connecting a coolant supply to said channel;

b) a second body section optically aligned with and joined to said first body section carrying a lens subassembly for receiving laser energy from said array and projecting it as a beam along an optical path;

c) said second body section including a coupler for removably coupling an optical fiber to said optical path for transmission of said beam externally of the module, said coupler correctly aligning the optical fiber with said optical path.

2. The module of claim 1 wherein said diode array is mounted directly to said channel.

3. The module of claim 1 wherein said diode array is mounted on a substrate which is in thermal relation with said channel.

4. The module of claim 3 wherein said substrate is formed of diamond.

5. The module of claim 1 wherein said means for connecting includes a coolant coupler permitting coolant to enter and exit said first body section and further including a manifold for releasably engaging said coolant coupler, said manifold being in communication with said coolant supply.

6. The module of claim 1 wherein said means for circulating includes a channel in thermal relation with said diode array through which said coolant is circulated and wherein said means for connecting includes plugs for releasably engaging a tube disposed in said channel through which coolant flows, said plugs communicating with said coolant supply, said tube being in thermal relation with said diode array.

7. The module of claim 1 wherein said first body section includes means for permitting alignment of said laser diode array with said lens subassembly during assembly of said module by monitoring the output of said lens subassembly.

8. The module of claim 1 wherein said second body section is bonded to said first body section.

9. The module of claim 1 wherein the lens subassembly is disposed in an optical coupler secured to said second body section.

10. The module of claim 9 wherein said optical coupler is secured to said second body section at a position selected to accurately focus the laser beam along said optical path.

11. The module of claim 9 wherein said optical coupler includes means for coupling an external optical cable to said optical path.

12. The module of claim 1 wherein a ceramic disk is disposed between and secured to said first and second body sections, said laser diode array being mounted to said disk.

13. The module of claim 12 wherein said laser diode array is mounted to said disk via a diamond substrate.

14. A method of constructing a laser module and connecting an optical fiber thereto comprising the steps of:
   a) providing a first body section having a laser diode array rigidly attached thereto and a liquid coolant channel in thermal relation with said diode array through which coolant may be circulated;
   b) providing a second body section having a lens subassembly rigidly attached thereto and means for removably coupling an optical fiber to said second body section;
   c) activating said laser diode array to project laser energy from said array through said lens subassembly;
   d) monitoring the output of said lens subassembly;
   e) optically aligning said first and second body sections based on the output of said lens subassembly;
   f) rigidly securing said first and second body sections in said optically aligned state to create a fixed optical path; and
   g) connecting an optical fiber to the optical path via said coupling means, whereby the optical fiber is correctly aligned with said optical path.

15. A method according to claim 14 wherein said step of rigidly securing said first and second body sections comprises rigidly fixing said first and second body sections to one another.

16. A method according to claim 15 wherein said step of rigidly fixing said first and second body sections to one another comprises bonding said first and second body sections to one another.

17. A method according to claim 14 wherein the step of optically aligning said first and second body sections is performed by setting focus and power output using a predetermined duty cycle of operation of said laser diode array.

* * * * *